(12) United States Patent
Rouchier et al.

(10) Patent No.: US 11,189,519 B2
(45) Date of Patent: Nov. 30, 2021

(54) MASKING A ZONE AT THE EDGE OF A DONOR SUBSTRATE DURING AN ION IMPLANTATION STEP

(71) Applicants: Soitec, Bernin (FR); Commissariat A L'Energie Atomique et aux Énergies Alternatives, Paris (FR)

(72) Inventors: Séverin Rouchier, La Tour du Pin (FR); Frédéric Mazen, Saint Egreve (FR)

(73) Assignees: Soitec, Bernin (FR); Commissariat a L'Energie Atomique Et Aux Energies Alternatives, Paris (FR)

( * ) Notice: Subject to any disclaimer, the term of this patent is extended or adjusted under 35 U.S.C. 154(b) by 14 days.

(21) Appl. No.: 16/486,655

(22) PCT Filed: Feb. 15, 2018

(86) PCT No.: PCT/EP2018/053755
§ 371 (c)(1),
(2) Date: Aug. 16, 2019

(87) PCT Pub. No.: WO2018/149906
PCT Pub. Date: Aug. 23, 2018

(65) Prior Publication Data
US 2021/0143052 A1    May 13, 2021

(30) Foreign Application Priority Data
Feb. 17, 2017 (FR) .................................. 1751296

(51) Int. Cl.
*H01L 21/70* (2006.01)
*H01L 21/44* (2006.01)
(Continued)

(52) U.S. Cl.
CPC ...... *H01L 21/76254* (2013.01); *H01L 21/266* (2013.01); *H01L 21/76237* (2013.01)

(58) Field of Classification Search
CPC .................... H01L 21/76254; H01L 21/76237
(Continued)

(56) References Cited

U.S. PATENT DOCUMENTS 8,993,461 B2 * 3/2015 Radu ................. H01L 21/26506
 438/795
9,646,873 B2 * 5/2017 Konishi ............ H01L 29/78657
(Continued)

FOREIGN PATENT DOCUMENTS

WO    2009/007003 A1    1/2009

OTHER PUBLICATIONS

International Search Report for International Application No. PCT/EP2018/053755 dated May 9, 2018, 3 pages.
(Continued)

*Primary Examiner* — Calvin Lee
(74) *Attorney, Agent, or Firm* — TraskBritt

(57) ABSTRACT

A process for forming a predetermined separation zone inside a donor substrate, in particular, to be used in a process of transferring a layer onto a carrier substrate comprises an implantation step that is carried out such that the implantation dose in a zone of the edge of the donor substrate is lower than the implantation dose in a central zone of the donor substrate to limit the formation of particles during thermal annealing. The present disclosure also relates to a donor substrate for a process of transferring a thin layer onto a carrier substrate produced by means of the process described above. The present disclosure also relates to a device for limiting an implantation region to a zone of the edge of a donor substrate.

13 Claims, 4 Drawing Sheets

(51) Int. Cl.
  *H01L 21/762* (2006.01)
  *H01L 21/266* (2006.01)
(58) Field of Classification Search
  USPC ......... 257/599; 438/246, 389, 433, 524, 526
  See application file for complete search history.

(56) References Cited

U.S. PATENT DOCUMENTS

| | | | |
|---|---|---|---|
| 10,186,630 B2* | 1/2019 | Henley | ............... C23C 16/0227 |
| 10,777,447 B2* | 9/2020 | Ecarnot | ................... H01L 21/84 |
| 10,818,540 B2* | 10/2020 | Samanta | ........... H01L 21/76254 |
| 2007/0023867 A1 | 2/2007 | Aulnette et al. | |
| 2012/0199956 A1* | 8/2012 | Lecomte | .......... H01L 21/02032 |
| | | | 257/629 |
| 2014/0097523 A1 | 4/2014 | Aga et al. | |
| 2020/0303242 A1* | 9/2020 | Ghyselen | .............. H01L 41/312 |

OTHER PUBLICATIONS

International Written Opinion for International Application No. PCT/EP2018/053755 dated May 9, 2018, 6 pages.
French Search Report and Written Opinion for French Application No. 1751296 dated Nov. 6, 2017, 7 pages.
Singapore Written Opinion For Application No. 11201905927X dated May 14, 2020, 6 pages.
Taiwanese Office Action for Application No. 107104970 dated Feb. 2, 2021, 15 pages.
Singapore Second Written Opinion For Application No. 11201905927X dated May 10, 2021, 5 pages.

* cited by examiner

MASKING A ZONE AT THE EDGE OF A DONOR SUBSTRATE DURING AN ION IMPLANTATION STEP

CROSS-REFERENCE TO RELATED APPLICATIONS

This application is a national phase entry under 35 U.S.C. § 371 of International Patent Application PCT/EP2018/053755, filed Feb. 15, 2018, designating the United States of America and published as International Patent Publication WO 2018/149906 A1 on Aug. 23, 2018, which claims the benefit under Article 8 of the Patent Cooperation Treaty to French Patent Application Serial No. 1751296, filed Feb. 17, 2017.

TECHNICAL FIELD

The present disclosure relates to the field of fabricating semiconductor-on-insulator (SeOI) substrates and, more particularly, to the ion implantation step carried out on a donor substrate to produce a predetermined separation zone inside the donor substrate.

BACKGROUND

A semiconductor-on-insulator (SeOI) substrate may be obtained by means of a Smart Cut™ process. In this type of process, a layer is transferred from a donor substrate onto a carrier substrate by propagating a fracture wave along an interface in the donor substrate. The interface is weakened beforehand by ion implantation, during a thermal annealing. During fracturing, micrometer-sized particles are created, in particular, at the edge of the SeOI substrate.

It thus subsequently becomes necessary to clean the SeOI substrate and/or the remainder of the donor substrate using RCA cleaning processes. This therefore represents a loss of time and of resources.

BRIEF SUMMARY

The object of the present disclosure is therefore to overcome the drawbacks described above by providing a process making it possible to fabricate a donor substrate with a predetermined separation zone for transferring a layer from the donor substrate onto a carrier substrate, making it possible to decrease the level of particles produced during the step of detaching the carrier substrate with the transferred layer from the remainder of the donor substrate.

The object of the present disclosure is achieved by means of a process for forming a predetermined separation zone inside a donor substrate, in particular, to be used in a process of transferring a layer onto a carrier substrate, characterized in that the process comprises an ion implantation step that is carried out such that the implantation dose in a zone at the edge of the donor substrate is lower than the implantation dose in a central zone of the donor substrate. Thus, the zone at the edge of the donor substrate, where there may be an absence of bonding with the carrier substrate, is less damaged by the implantation step than the central zone of the donor substrate.

Thus, in this zone, there cannot be any stiffening effect due to the presence of the carrier substrate and the implantation at a lower dose decreases the formation of blisters and peeling during the thermal debonding treatment and ultimately decreases the creation of particles.

According to one variant of the present disclosure, the implantation step may be carried out such that the implantation is limited to the central zone of the donor substrate. Thus, the ions are not implanted into the zone of the edge of the substrate and this zone is therefore free of implanted ions, thereby further decreasing the creation of particles during annealing.

According to another variant of the present disclosure, the zone of the edge of the donor substrate may comprise or may be limited to a chamfered zone on the edge of the donor substrate. The chamfered zone of a substrate corresponds to a zone on the edge of a substrate where the edge has been slanted such that the sharp angle of the edge has been broken. The width of the chamfered zone of a substrate is typically of the order of 0.5 to 3 mm. When bonding the donor substrate to the carrier substrate, the chamfered zone remains unbonded and the formation of blisters during thermal annealing may therefore be limited or absent in this zone.

According to one variant of the present disclosure, the width of the zone of the edge of the substrate may be between 1 mm and 5 mm, in particular, between 1 mm and 2 mm. Thus, the zone of the edge of the substrate may be chosen to be slightly larger than the chamfered zone.

According to one variant of the present disclosure, the implantation of ions may be carried out using a mask on or above the zone of the edge of the substrate. According to one alternative of the present disclosure, the implantation of ions may be carried out by scanning the substrate with an ion beam such that the implantation dose in the zone at the edge of the donor substrate is lower than the implantation dose in the central zone of the donor substrate, in particular, such that the implantation is limited to the central zone of the donor substrate. These two process variants may be carried out in a straightforward manner.

According to one variant of the present disclosure, the implantation of ions may comprise an implantation of hydrogen ions (H) or a co-implantation of helium and hydrogen ions (He—H).

According to another variant of the present disclosure, the process may comprise a second ion implantation step, in particular, carried out over the entire surface of the substrate with an implantation dose that is lower than in the first implantation step. Due to the lower concentration of the co-implant, the creation of particles during a thermal annealing may be avoided or at least decreased.

According to one variant of the present disclosure, the first implantation step may be an implantation of helium ions and the second implantation step may be an implantation of hydrogen ions.

According to one variant of the present disclosure, the implantation dose in the zone of the edge of the donor substrate may be lower than $1e16$ at/cm$^2$, in particular, between $0.5e16$ at/cm$^2$ and $7e16$ at/cm$^2$. For such implantation doses in the zone of the edge of the donor substrate, the creation of particles during a thermal annealing may be avoided or at least decreased.

The object of the present disclosure is also achieved by means of a donor substrate for a process of transferring a thin layer onto a carrier substrate, comprising a predetermined separation zone wherein the implantation dose in a zone of the edge of the donor substrate is lower than the implantation dose in a central zone of the donor substrate, in particular, produced by means of the process described above. The advantage is that, with such a substrate, a decrease in the level of particles produced in the detachment step of the layer transfer process is obtained.

The object of the present disclosure may also be achieved by means of a process of transferring a thin layer from a donor substrate onto a carrier substrate, comprising the steps:

a) attaching a donor substrate described above to a carrier substrate; and b) carrying out a detachment at the site of the predetermined separation zone to detach a remaining portion of the donor substrate from the layer transferred to the carrier substrate. With this process using the donor substrate of the present disclosure, a layer may be transferred while creating fewer particles.

According to one variant of the process, step b) may comprise a thermal annealing.

The object of the present disclosure may also be achieved by means of a device for limiting an implantation region to a zone of the edge of a donor substrate, in particular, a donor substrate such as described above, characterized in that the device includes a means suitable for carrying out the implantation such that the implantation dose toward a zone at the edge of the donor substrate is lower than the implantation dose in a central zone of the donor substrate. Thus, it is possible to control the location of the implantation zones on a substrate, in particular, to delimit an implantation zone to a central zone of the substrate, to be able to decrease the creation of particles in a layer transfer process such as described above.

According to one variant of the present disclosure, the means for limiting the implantation region to the central zone of the donor substrate may comprise a mask. According to another alternative of the present disclosure, the mask may be a ring positioned on or above the donor substrate. According to one alternative of the present disclosure, the mask may be configured to mask the zone of the edge of a donor substrate over a width between 1 mm and 5 mm, in particular, between 1 and 2 mm. Thus, the implantation profile in a substrate may be modified and predetermined in a straightforward manner to obtain implantation zones having varied doses in one and the same substrate.

According to one alternative, the object of the present disclosure may also be achieved by means of an ion implanter for implanting ions into a donor substrate comprising a device such as described above. Thus, an ion implanter may provide greater possibilities with respect to controlling the location of the implantation zones on a substrate, in particular, of delimiting an implantation zone to a central zone of the substrate.

BRIEF DESCRIPTION OF THE DRAWINGS

The present disclosure may be understood by referring to the following description together with the appended figures, wherein numerical references identify the elements of the present disclosure.

DETAILED DESCRIPTION

Figure 1:
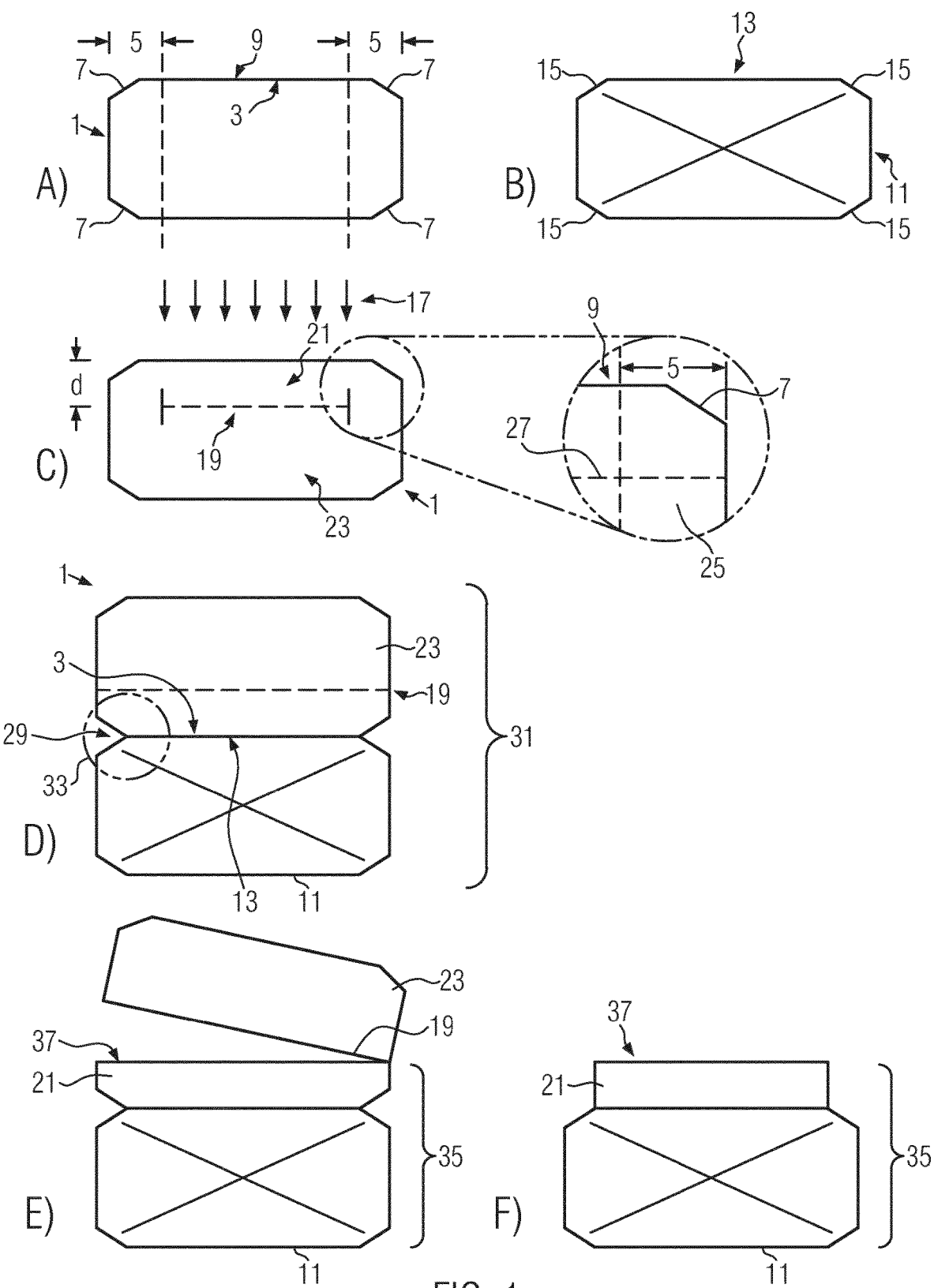
FIGS. 1a to 1f schematically show the various steps of the process of transferring a thin layer from a donor substrate onto a carrier substrate according to the present disclosure.

The process of transferring a thin layer from a donor substrate onto a carrier substrate according to the present disclosure is described in detail by FIGS. 1a to 1f. It comprises the steps of forming a predetermined separation zone in a donor substrate (FIGS. 1a to 1c), of attaching a donor substrate to a carrier substrate (FIG. 1d) and of detaching and transferring a thin layer from a donor substrate onto a carrier substrate (FIGS. 1e and 1f).

FIG. 1a shows a donor substrate 1, for example, a silicon substrate or any other semiconductor substrate, with or without other layers, such as a surface oxide. The donor substrate 1 has, on its main surface 3, a zone of the edge 5 of the substrate comprising a chamfered zone 7. Typically, the width of the chamfered zone ranges from 0.5 mm to 3 mm. The donor substrate 1 also comprises a central zone 9 delimited within the zone of the edge 5.

FIG. 1b shows a carrier substrate 11 with a main surface 13. The carrier substrate 11 is, for example, a silicon substrate or any other substrate, with or without other layers, such as a surface oxide. Like the donor substrate 1, the carrier substrate 11 may have a chamfered zone 15 on its border.

Next, such as illustrated in FIG. 1c, the donor substrate 1 is subjected to a step of implantation of ionic or atomic species 17. This implantation process introduces ionic or atomic species 17 into the donor substrate 1 with a maximum concentration at a predetermined depth d of the donor substrate 1 with respect to the bombarded surface 3, to create a weakened zone 19 therein.

The implantation of ionic or atomic species 17 may be a single implantation, i.e., the implantation of a single atomic species, such as, for example, an implantation of hydrogen, helium or any other noble gas. The implantation may also be a co-implantation of ionic or atomic species 17, i.e., an implantation of at least two different species, such as, for example, the co-implantation of helium (95 keV and 2 5e16 at/cm$^2$) and of hydrogen (65 keV and 1.5e16 at/cm$^2$).

The weakened zone 19 forms the border between a layer 21 and the remainder 23 of the donor substrate 1. The weakened zone 19 is also referred to hereinafter as the predetermined separation zone.

According to the present disclosure, the implantation of ionic or atomic species 17, is carried out such that the implantation dose 25 at the site of the zone of the edge 5 of the donor substrate 1 is lower than the implantation dose 27 in the central zone 9 of the donor substrate 1 and is shown in the schematic enlargement of FIG. 1c.

According to one variant of the present disclosure, the dose of implanted ions in the zone of the edge 5 of the donor substrate 1 is less than 1e16 at/cm$^2$ or else is even free of implanted ions.

FIG. 1d shows the step where the carrier substrate 11 is brought into contact, via one of its main surfaces 13, with the surface 3 of the donor substrate 1 so as to join the two substrates together. The bond between the donor and carrier substrates 1 and 11 is formed by molecular adhesion at the bond interface to form a multilayer stack 31. At the site of the chamfered zones 7 and 15 of the donor substrate 1 and of the carrier substrate 11, respectively, a zone without bonding 33 may be observed.

FIG. 1e shows the step of detachment from the remainder 23 of the donor substrate 1, along the weakened zone 19, so as to transfer the layer 21 onto the carrier substrate 11 in order to create the semiconductor substrate 35.

By way of example, the detachment may be carried out by means of heat treatment by subjecting the multilayer stack 31, illustrated in FIG. 1d, to a thermal annealing, during which a spontaneous detachment from the remainder 23 of the donor substrate 1 takes place along the predetermined separation zone 19. This thermal detachment is typically carried out in an oven at temperatures between 100 C and 700° C., preferably at about 500° C. As an alternative, the thermal detachment may be accompanied by a mechanical treatment, for example, by using a blade on the predetermined separation zone 19.

FIG. 1f shows the final semiconductor substrate 35, with the transferred layer 21 on the carrier substrate 11. In comparison with the layer transfer processes of the prior art, implanting fewer ions into the zone of the edge 5 with respect to the central zone 9 in the donor substrate 1 has the effect that, during the detachment, fewer particles are created both on the surface 37 of the semiconductor substrate 35 but also on the surface of the remainder 23 of the donor substrate 1.

Specifically, because of the zone without bonding 29 in the multilayer stack 31 illustrated in FIG. 1d, there is no stiffening effect in this zone and a heavy implantation of ions into the zone of the edge 5 leads to the formation of blisters and peeling during the heat treatment of the detachment step in the layer transfer processes according to the processes known in the prior art.

An effect decreasing the creation of particles is particularly visible for transfers of semiconductor layers without surface oxide.

Figure 2A:
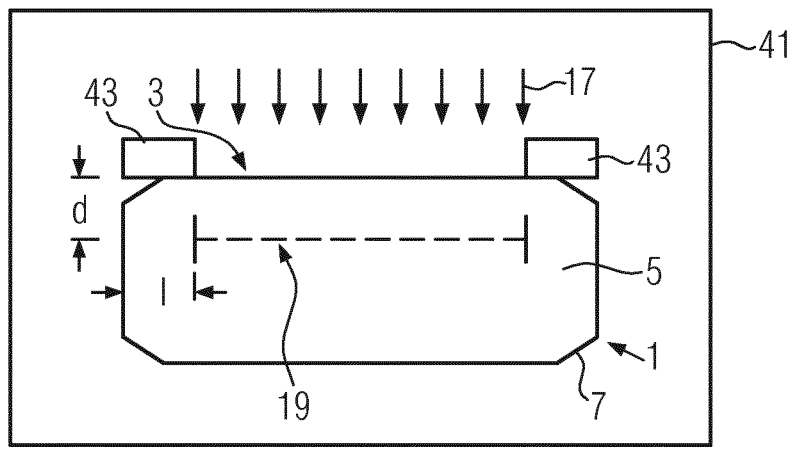
FIG. 2a shows a diagram for masking the edge of a substrate in an implantation step according to one variant of the present disclosure.
Figure 2B:
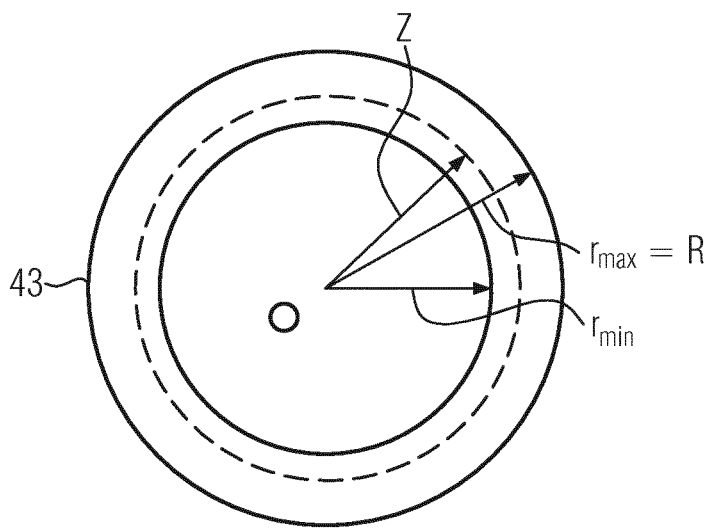
FIG. 2b shows a schematic view from above of a mask used for masking a zone of the edge of a substrate during the implantation according to one variant of the present disclosure.

FIG. 2a shows one embodiment of the operation of masking the zone of the edge 5 of the donor substrate 1 according to the present disclosure when a mask is used in the implantation step shown in FIG. 1c. FIG. 2b shows a mask used for masking the zone of the edge 5 of the donor substrate 1 during the implantation according to this variant of the present disclosure.

The donor substrate 1, such as described above, is placed in an implanter 41 and is subjected to an implantation of ionic or atomic species 17, such as described above. This implantation process therefore introduces the implanted ionic or atomic species 17 into the donor substrate 1 with a maximum concentration at the predetermined depth d to create the weakened zone 19 therein.

A mask 43 is placed on the donor substrate 1 to mask the zone of the edge 5 from the implantation of ionic or atomic species 17 so as to avoid the implantation of ions into this zone 15. According to this variant of the present disclosure, the mask 43 masks at least the chamfered zone 7 of the donor substrate 1. In particular, the mask 43 masks a zone of the edge 5 of the donor substrate 1 over a width I that is between 1 mm and 5 mm, in particular, between 1 and 2 mm.

According to another variant of the present disclosure, the mask 43 may also be placed above the donor substrate 1, without direct contact, but still in the path of the ion beam 45.

FIG. 2b schematically shows the mask 43 seen from above. In a non-limiting manner, the mask 43 takes the shape of a ring. Thus, the zone of the edge 5 of the donor substrate 1, such as illustrated in FIG. 2a, cannot be reached by the ions. Specifically, the ions are stopped in the mask 43.

The mask 43 may be made of Teflon, of aluminum, or of any other suitable materials. According to one variant, the mask 43 may also be a sacrificial mask made of resist, of hard oxide or of nitride on the donor substrate 1 that will be removed before the step of attaching the donor substrate to the carrier substrate.

With respect to the radius R of the donor substrate 1, the mask 43 has an inner radius $r_{min}$ of R minus 1 to 5 mm to be able to cover at least the chamfered zone 7 of the donor substrate 1 and an outer radius $r_{max}$ of at least R.

Figure 2C:
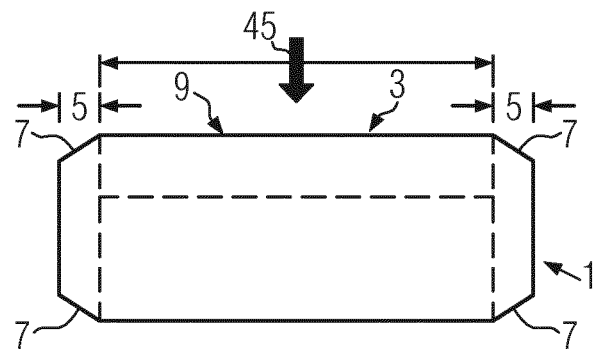
FIG. 2c schematically shows an operation of scanning with the implantation ion beam during an implantation step according to one variant of the present disclosure.

Instead of using a mask 43, the donor substrate 1 may also be implanted by scanning the ion beam 45 over the surface 3 of the donor substrate 1, as illustrated by the arrow in FIG. 2c. The motion of the ion beam 45 is controlled such that the zone at the edge 5 of the donor substrate 1 is excluded from ion implantation or contains an implantation dose that is lower than the central zone 9 of the donor substrate 1.

Figure 3A:
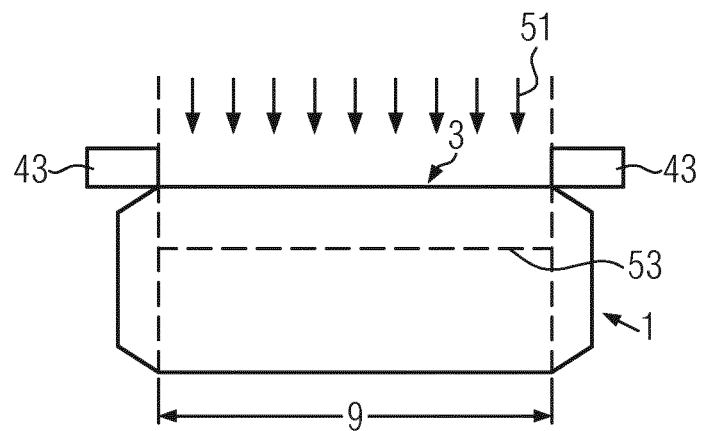
FIGS. 3a and 3b schematically show another embodiment of the present disclosure, wherein the donor substrate is subjected to two successive implantation steps.
Figure 3B:
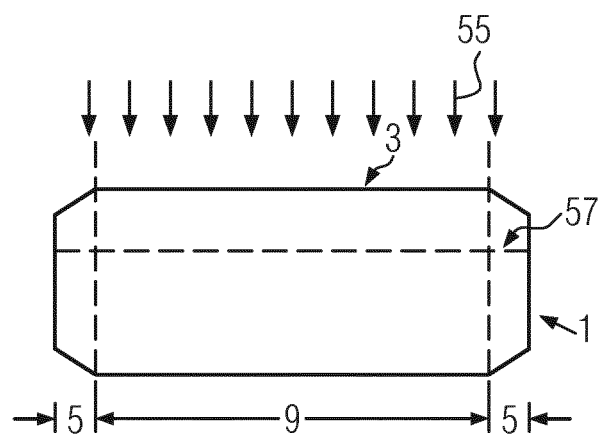

FIGS. 3a and 3b illustrate another embodiment of the present disclosure. Here, the donor substrate 1 is subjected to two successive implantation steps, such that the implantation dose toward a zone at the edge of the donor substrate is lower than the implantation dose in a central zone of the donor substrate. Those elements or features that share reference numerals with the above figures will not be described again in detail, but reference will be made thereto.

FIG. 3a shows the ion implantation 51 of He ions (95 keV and 2.5e16 at/cm$^2$) using the mask 43 into the central zone 9 of the donor substrate 1 to create a separation zone 53 therein.

FIG. 3b illustrates the second ion implantation step 55 using H ions without using a mask. The hydrogen implantation dose must be lower than 2e16 at/cm$^2$, preferably between 0.5e16 at/cm$^2$ and 1.5e16 at/cm$^2$. Consequently, the implanted H ions 57 are present both in the central zone 9 but also in the zone of the edge 5 of the donor substrate 1, substantially at the same depth inside the donor substrate 1 as the He ions.

Figure 4A:
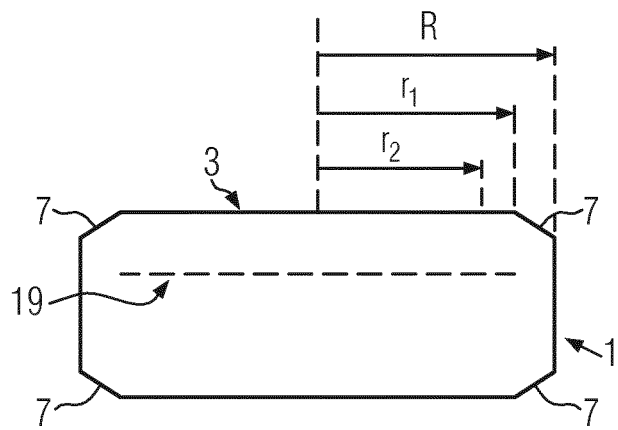
FIGS. 4a and 4b show a view from above and a profile view, respectively, of a donor substrate comprising a predetermined separation zone fabricated according to one variant of the present disclosure.
Figure 4B:
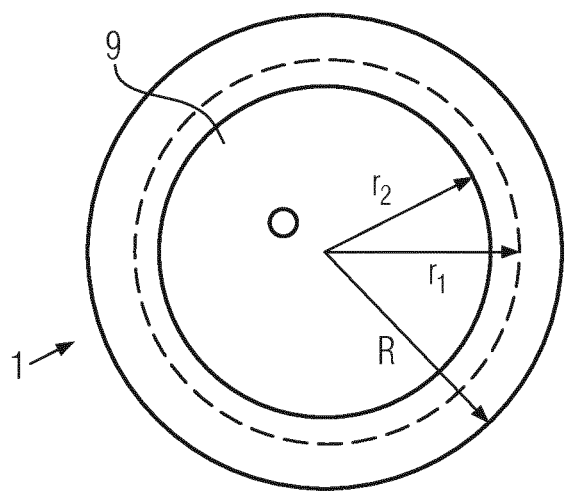
Figure 4C:
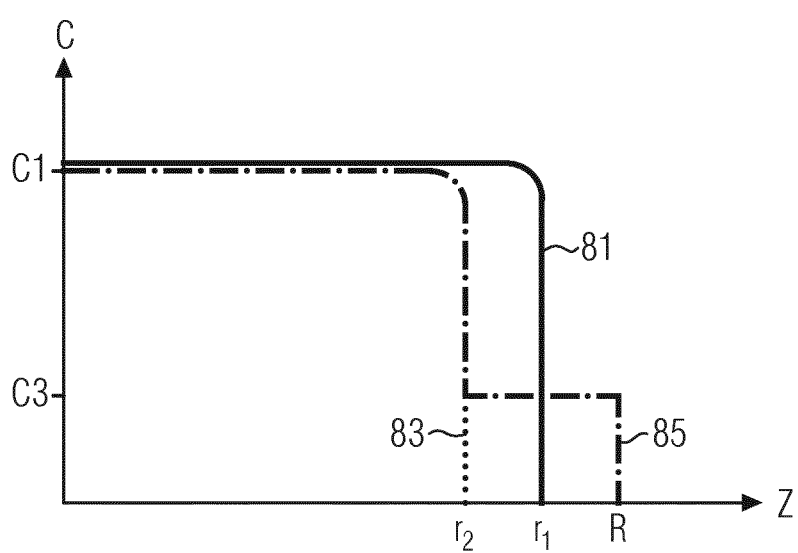
FIG. 4c shows implantation profiles in donor substrates according to examples according to the present disclosure.

FIGS. 4a and 4b show a profile view and a view from above, respectively, of a donor substrate fabricated according to the present disclosure such as described above. FIG. 4c shows the ion implantation profiles of various examples of donor substrates according to the present disclosure. Those elements or features that share reference numerals with the above figures will not be described again in detail, but reference will be made thereto.

The donor substrate 1, for example, a silicon wafer, comprises a predetermined separation zone 19 at a distance d from the main surface 3 of the donor substrate 1. The zone of the edge 5 of the donor substrate 1 comprises a chamfered zone 7, the width typically being between 0.5 and 3 mm.

FIGS. 4a and 4b also show, from the center of the main surface 3 as the origin O, the radius R of the donor substrate 1. The reference r–ι in FIGS. 4a and 4b represents the distance from the center O and the start of the chamfered zone 7 is located from the edge of the donor substrate 1. The reference $r_2$ in FIGS. 4a and 4b illustrates the radius delimiting the zone of the edge 5 of the donor substrate 1, hence the region of the implantation dose starts to be lower with respect to the central zone 9 of the donor substrate 1.

The delimitation of the predetermined separation zone 19 may be correlated with the implantation profiles of the donor substrates according to the examples of FIG. 4c.

In FIG. 4c, the implantation dose c in a donor substrate is shown on the (logarithmic) Y-axis and the radial direction r with the origin 0 at the center of the donor substrate 1 is shown on the X-axis.

Example 1

The line 81 represents the implantation profile in the donor substrate 1 according to a first example of the present disclosure. The He ions are implanted with an implantation dose c1 (95 keV and 2.5e16 at/cm²) using a mask 43 such as shown in FIG. 2d to mask the zone of the edge 5 of the donor substrate 1 that corresponds to the chamfered zone 7 of the donor substrate 1.

In this case r–, =r₂ and the central zone 9 of the donor substrate 1 that is implanted with the implantation dose c1 extends from the center O up to r^. From the distance [|$]$¨$$[|$]$¨AÄ[|$]$¨gi^, the implantation dose quickly becomes zero given that the mask 43 has masked the zone of the edge 5 from this distance r–i.

Example 2

According to a second example according to the present disclosure, the mask 43 may be chosen such that the zone of the edge 5 of the donor substrate 1, where the implantation dose of He ions is lower than the implantation dose of the central zone 9, is wider than the chamfered zone 7 of the donor substrate 1. Hence $r_2 < r-$.

Thus, the mask 43 to be used for the second example has an inner radius $r_{min}$ that is smaller than r–, and hence smaller than that of the first example. FIG. 4c represents the implantation profile of this example with the dotted line 83. Up to $r<r_2$, the implantation dose is c1 as in the first example. For $r>r_2$, the dose of implanted ions becomes zero.

The width, i.e., R–r₂, of the zone of the edge 5 of the donor substrate 1 that is masked from the implantation is between 1 mm and 5 mm, in particular, between 1 and 2 mm, to cover at least the chamfered zone 7 (as in example 1) and consequently the predetermined separation zone 19 present in the donor substrate 1 is free of implanted ions into this zone of the edge 5.

Given that the donor substrate 1 has a zone free of implanted ions in both examples, it is possible to observe a decrease in particles in a layer transfer process such as described in FIGS. 1a to 1f. Specifically, there is no formation of peeling blisters during the heat treatment in the portion without bonding 29 shown in FIG. 1d, which may create particles during the heat treatment of the detachment step.

Example 3

According to another example of the present disclosure, such as described with reference to FIGS. 3a and 3b, a second implantation step is carried out on the donor substrate after the first implantation and the corresponding implantation profile is shown by the dashed-dotted line 85 in FIG. 3c.

The first implantation step is carried out using the mask 43 to mask a zone of the edge 5 of the substrate that corresponds to example 2, the second implantation step is carried out through the entire surface 3 of the donor substrate with an implantation dose c3 of hydrogen ions that is lower than that in the first implantation step. For example, for an implantation of hydrogen ions, the implantation dose c3 is lower than 1e16 at/cm², typically between 0.5e16 at/cm² and 1e16 at/cm². In this example, there are implanted ions throughout the entire predetermined separation zone 19, up to the edge of the substrate.

Given that the second implantation has been carried out at a low dose in the zone of the edge 5 of the donor substrate 1 that corresponds to the chamfered zone 7 of the substrate, it also decreases the risk of forming peeling blisters during the thermal detachment treatment in a layer transfer process such as shown in FIGS. 1a to 1f.

A certain number of embodiments of the present disclosure have been described. However, it will be appreciated that various modifications and improvements may be made without departing from the scope of the present disclosure.

The invention claimed is:

1. A process for forming a predetermined separation zone inside a donor substrate to be used in a process of transferring a layer onto a carrier substrate, comprising:
   implantation of atoms and/or ions into a central zone of a donor substrate, the donor substrate comprising an edge slanted relative to a surface of the donor substrate, wherein the edge slanted relative to the surface of the donor substrate is free of implanted atoms and/or ions, such that an implantation dose in a zone of an edge of the donor substrate is lower than an implantation dose in a central zone of the donor substrate.

2. The process of claim 1, further comprising an additional implantation of atoms and/or ions carried out over the central zone of the donor substrate, the additional implantation having an additional implantation dose lower than in the implantation dose in the central zone of the donor substrate.

3. The process of claim 1, wherein the implantation of the atoms and/or ions comprises scanning the donor substrate with an ion beam such that an implantation dose toward the edge slanted relative to the surface of the donor substrate is lower than the implantation dose in the central zone of the donor substrate.

4. The process of claim 2, wherein the implantation of atoms and/or ions comprises an implantation of helium ions, and wherein the additional implantation of atoms and/or ions comprises an implantation of hydrogen ions.

5. The process of claim 1, wherein the implantation of the atoms and/or ions comprises using a mask on or above the edge slanted relative to the surface of the donor substrate.

6. The process of claim 1, wherein the atoms and/or ions comprise helium ions (He) or a helium and hydrogen ions (He—H).

7. A process for transferring a layer of a donor substrate onto a carrier substrate, comprising the following steps:
   a) attaching a donor substrate to a carrier substrate, the donor substrate comprising a central zone including implanted atoms and/or ions, wherein an implantation dose in a separation zone is lower in a zone of an edge of the donor substrate than an implantation dose in the separation zone in a central zone of the donor substrate, and wherein an edge is slanted relative to a surface of the donor substrate, and the slanted edge relative to the surface of the donor substrate is free of implanted atoms and/or ions; and
   b) detaching the donor substrate to detach a remaining portion of the donor substrate from a layer transferred to the carrier substrate.

8. The process of claim 7, wherein step b) comprises a thermal annealing of the donor substrate.

9. A device for limiting an implantation region of a donor substrate, the device comprising:

a limiting means for carrying out an implantation of atoms and/or ions into a central zone of the donor substrate, such that an implantation dose in a zone of an edge of the donor substrate is lower than an implantation dose in a central zone of the donor substrate, and the donor substrate comprising an edge slanted relative to a surface of the donor substrate, wherein the edge slanted relative to the surface of the donor substrate is free of implanted atoms and/or ions.

10. An ion implanter for implanting ions into a donor substrate comprising a device according to claim 9.

11. The device of claim 9, wherein the limiting means comprises a mask.

12. The device of claim 11, wherein the mask comprises a ring positioned on or above the donor substrate.

13. A donor substrate for a process of transferring a layer onto a carrier substrate, comprising:

a separation zone including implanted atoms and/or ions, an implantation dose in the separation zone being lower in a zone of an edge of the donor substrate than an implantation dose in the separation zone in a central zone of the donor substrate;

atoms and/or ions implanted into a central zone of the donor substrate; and an edge slanted relative to a surface of the donor substrate, wherein the edge slanted relative to the surface of the donor substrate is free of implanted atoms and/or ions.

\* \* \* \* \*